United States Patent
Imaoka et al.

(10) Patent No.: US 9,773,678 B2
(45) Date of Patent: Sep. 26, 2017

(54) SEMICONDUCTOR SUBSTRATE AND METHOD FOR MANUFACTURING SEMICONDUCTOR SUBSTRATE

(71) Applicants: KABUSHIKI KAISHA TOYOTA JIDOSHOKKI, Kariya-shi, Aichi-ken (JP); SICOXS CORPORATION, Tokyo (JP)

(72) Inventors: Ko Imaoka, Kariya (JP); Motoki Kobayashi, Tokyo (JP); Hidetsugu Uchida, Tokyo (JP); Kuniaki Yagi, Tokyo (JP); Takamitsu Kawahara, Tokyo (JP); Naoki Hatta, Tokyo (JP); Akiyuki Minami, Tokyo (JP); Toyokazu Sakata, Tokyo (JP); Tomoatsu Makino, Tokyo (JP); Mitsuharu Kato, Tokyo (JP)

(73) Assignees: KABUSHIKI KAISHA TOYOTA JIDOSHOKKI, Kariya-shi, Aichi (JP); SICOXS CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/325,016

(22) PCT Filed: Jul. 9, 2015

(86) PCT No.: PCT/JP2015/069792
§ 371 (c)(1),
(2) Date: Jan. 9, 2017

(87) PCT Pub. No.: WO2016/006663
PCT Pub. Date: Jan. 14, 2016

(65) Prior Publication Data
US 2017/0213735 A1    Jul. 27, 2017

(30) Foreign Application Priority Data

Jul. 10, 2014  (JP) ................................. 2014-142353
Aug. 29, 2014  (JP) ................................. 2014-189416

(51) Int. Cl.
*H01L 21/265*        (2006.01)
*H01L 29/36*         (2006.01)
(Continued)

(52) U.S. Cl.
CPC ...... *H01L 21/26506* (2013.01); *H01L 21/187* (2013.01); *H01L 21/324* (2013.01);
(Continued)

(58) Field of Classification Search
CPC .. H01L 21/2656; H01L 21/185; H01L 21/187
See application file for complete search history.

(56) References Cited

U.S. PATENT DOCUMENTS 5,855,693 A * 1/1999 Murari ................ H01L 21/2007
                                                    148/33.3
6,153,495 A * 11/2000 Kub ..................... H01L 21/187
                                                    257/E21.054
(Continued)

FOREIGN PATENT DOCUMENTS

JP       10-92702 A       4/1998
JP       2003-249426 A    9/2003
(Continued)

OTHER PUBLICATIONS

International Preliminary Report on Patentability and Written Opinion mailed by the International Bureau in corresponding International Application No. PCT/JP2015/069792, on Jan. 19, 2017.
(Continued)

*Primary Examiner* — Earl Taylor
(74) *Attorney, Agent, or Firm* — Sughrue Mion, PLLC

(57) ABSTRACT

A method for manufacturing a semiconductor substrate may comprise irradiating a surface of a first semiconductor layer
(Continued)

and a surface of a second semiconductor layer with one or more types of first impurity in a vacuum. The method may comprise bonding the surface of the first semiconductor layer and the surface of the second semiconductor layer to each other in the vacuum. The method may comprise applying heat treatment to the semiconductor substrate produced in the bonding. The first impurity may be an inert impurity that does not generate carriers in the first and second semiconductor layers. The heat treatment may be applied such that a width of an in-depth concentration profile of the first impurity contained in the first and second semiconductor layers is narrower after execution of the heat treatment than before the execution of the heat treatment.

19 Claims, 9 Drawing Sheets

(51) Int. Cl.
    *H01L 29/04*      (2006.01)
    *H01L 29/16*      (2006.01)
    *H01L 29/167*     (2006.01)
    *H01L 21/324*     (2006.01)
    *H01L 21/18*      (2006.01)

(52) U.S. Cl.
     CPC ............ *H01L 29/04* (2013.01); *H01L 29/167* (2013.01); *H01L 29/1608* (2013.01); *H01L 29/36* (2013.01)

(56) References Cited

U.S. PATENT DOCUMENTS

| | | | | |
|---|---|---|---|---|
| 6,194,290 B1* | 2/2001 | Kub | ...................... | H01L 21/187 257/E21.054 |
| 7,485,551 B2* | 2/2009 | Hebras | .............. | H01L 21/76254 438/455 |
| 7,883,628 B2* | 2/2011 | Neyret | ................. | H01L 21/302 216/33 |
| 8,951,896 B2* | 2/2015 | Botula | .................... | H01L 21/04 257/347 |
| 9,165,819 B2* | 10/2015 | Botula | .................... | H01L 21/04 |
| 2003/0129780 A1* | 7/2003 | Auberton-Herve | .......................... | H01L 21/76254 438/46 |
| 2005/0151155 A1* | 7/2005 | Auberton-Herve | .......................... | H01L 21/76254 257/103 |
| 2006/0154429 A1* | 7/2006 | de Souza | .......... | H01L 21/26506 438/305 |
| 2012/0128892 A1* | 5/2012 | Toyoda | ................... | C30B 33/00 427/523 |
| 2015/0004778 A1* | 1/2015 | Botula | .................... | H01L 21/04 438/510 |
| 2015/0072504 A1* | 3/2015 | Botula | .................... | H01L 21/04 438/455 |
| 2015/0262862 A1* | 9/2015 | Kawai | .................... | B82Y 30/00 257/506 |

FOREIGN PATENT DOCUMENTS

| | | | |
|---|---|---|---|
| JP | 2004-503942 A | | 2/2004 |
| JP | 2010-80834 A | | 4/2010 |
| JP | 2011-246761 A | | 12/2011 |
| JP | 2015115585 A | * | 6/2015 |
| WO | 2014/024611 A1 | | 2/2014 |

OTHER PUBLICATIONS

S. Essig et al., "Fast atom beam-activated n-Si/n-GaAs wafer bonding with high interfacial transparency and electrical conductivity", Journal of Applied Physics, 2013, pp. 203512-1-203512-6, vol. 113.
J. Suda et al.,"Characterization of 4H-SiC homoepitaxial layers grown on 100-mm-diameter 4H—SiC/poly-SiC bonded substrates", ICSCRM 2013 by Suda Kyoto University Author corrected paper.
International Search Report of PCT/JP2015/069792 dated Sep. 29, 2015 [PCT/ISA/210].
Written Opinion of PCT/JP2015/069792 dated Sep. 29, 2015 [PCT/ISA/237].

* cited by examiner

SEMICONDUCTOR SUBSTRATE AND METHOD FOR MANUFACTURING SEMICONDUCTOR SUBSTRATE

CROSS REFERENCE TO RELATED APPLICATIONS

This application is a National Stage of International Application No. PCT/JP2015/069792, filed Jul. 9, 2015, claiming priorities based on Japanese Patent Application Nos. 2014-142353, filed Jul. 10, 2014 and 2014-189416, filed Aug. 29, 2014, the contents of all of which are incorporated herein by reference in their entirety.

TECHNICAL FIELD

This application claims priority to Japanese Patent Application No. 2014-142353 filed on Jul. 10, 2014 and Japanese Patent Application No. 2014-189416 filed on Aug. 29, 2014, the contents of which are hereby incorporated by reference into the present application. The technology disclosed herein relates to a method for manufacturing a semiconductor substrate and the like that make it possible to improve the electrical characteristics of a semiconductor substrate including first and second semiconductor layers that are in contact with each other.

BACKGROUND ART

Japanese Unexamined Patent Application Publication (Translation of PCT Application) No. 2004-503942 discloses a method for manufacturing a substrate having an active layer of single-crystalline silicon carbide on polycrystalline silicon carbide. In the manufacturing method, an amorphous material layer (amorphous silicon) is deposited on a polycrystalline silicon carbide support. Then, the polycrystalline silicon carbide support and a single-crystalline silicon carbide substrate are placed on top of each other and united by direct bonding. It should be noted that the art of Non-patent Literature 1 is known as a related art. Non-patent Literature 1: JOURNAL OF APPLIED PHYSICS 113, 203512 (2013) Fast atom beam-activated n-Si/n-GaAs wafer bonding with high interfacial transparency and electrical conductivity (S. Essig, O. Moutanabbirt, Wekkeli, Nahme, Oliva, W. Bett, and F. Dimroth).

SUMMARY OF INVENTION

Technical Problem

Non-ohmic conduction may occur at the bonded interface between substrates. This undesirably affects device characteristics in the case of fabrication of a device having a current pathway formed across the bonded interface.

Solution to Problem

Disclosed herein is a method for manufacturing a semiconductor substrate. This method for manufacturing a semiconductor substrate is a method for manufacturing a semiconductor substrate including a first semiconductor layer and a second semiconductor layer that is in contact with the first semiconductor layer. This method for manufacturing a semiconductor substrate includes an irradiating step of irradiating a surface of the first semiconductor layer with one or more types of first impurity in a vacuum and irradiating a surface of the second semiconductor layer with the one or more types of first impurity in the vacuum. This method for manufacturing a semiconductor substrate further includes a bonding step of bonding the surface of the first semiconductor layer and the surface of the second semiconductor layer to each other in the vacuum in which the irradiating step was executed and thereby producing a semiconductor substrate having a bonded interface. This method for manufacturing a semiconductor substrate further includes a heat treating step of applying heat treatment to the semiconductor substrate produced in the bonding step. The first impurity is an inert impurity that does not generate carriers in the first and second semiconductor layers. The heat treatment is applied such that a width of an in-depth concentration profile of the first impurity contained in the first and second semiconductor layers is narrower after execution of the heat treating step than before the execution of the heat treating step.

The irradiating step causes the first impurity to be implanted into the vicinity of the surface of the first semiconductor layer and the vicinity of the surface of the second semiconductor layer. This causes the first impurity thus implanted to be present in the vicinity of the bonded interface between the first and second semiconductor layers, and the presence of the first impurity in the vicinity of the bonded interface may cause non-ohmic conduction to occur in a current pathway across the bonded interface. The method makes it possible to narrow the width of the in-depth concentration profile of the first impurity contained in the first and second semiconductor layers. This makes it possible to reduce, on the current pathway across the bonded interface, the distance of a pathway in which the first impurity is present, thus making it possible to prevent the occurrence of non-ohmic conduction.

Advantageous Effects of Invention

The technology disclosed herein makes it possible to provide a technology for improving the electrical characteristics of a semiconductor substrate including first and second semiconductor layers that are in contact with each other.

BEST MODE FOR CARRYING OUT THE INVENTION

Figure 1:
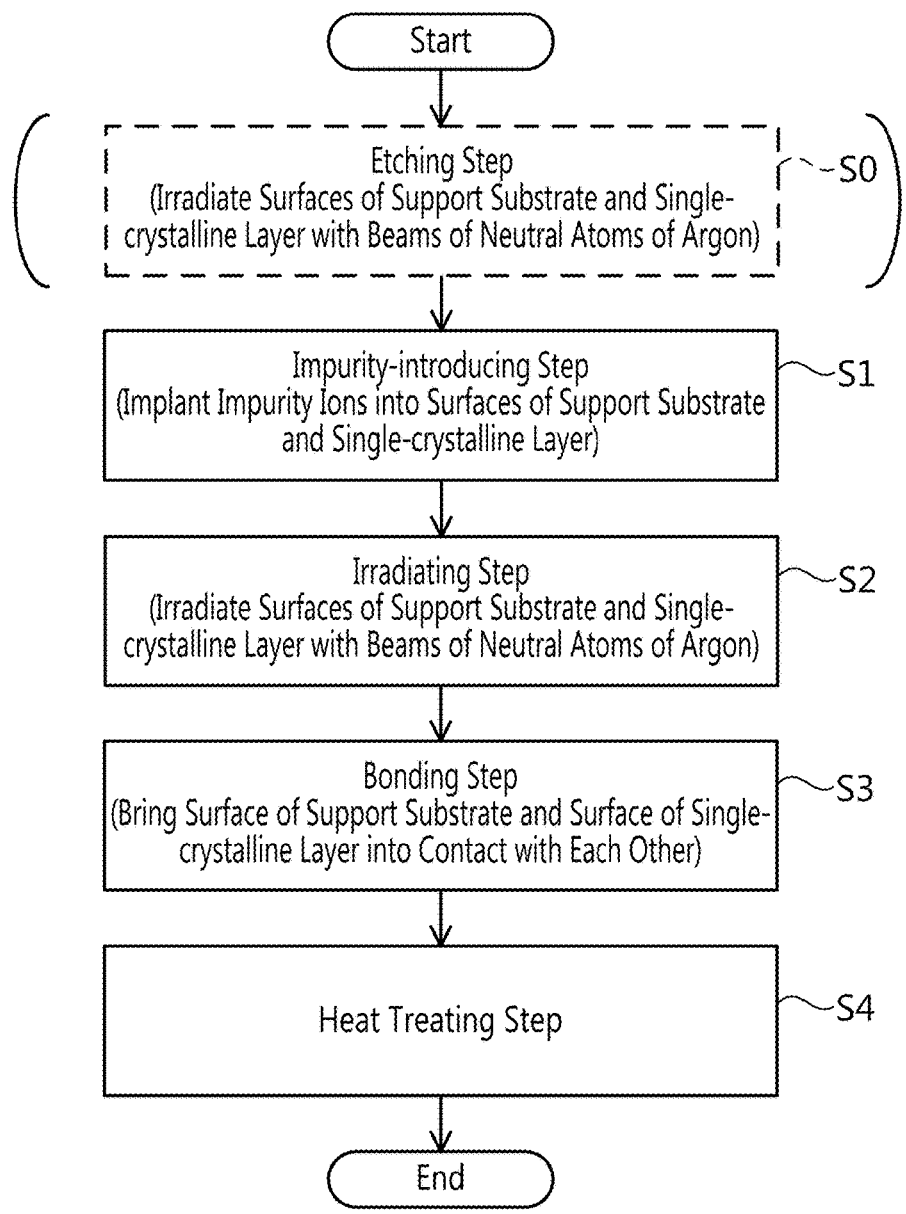
FIG. 1 is a flow chart showing a method for manufacturing a bonded substrate.

Preferred aspects of embodiments disclosed herein will be listed. It should be noted that elements described below may technically be useful alone.

(Feature 1) the heat treatment may be applied such that a concentration variation of the first impurity in an in-plane direction in the first and second semiconductor layers is greater after the execution of the heat treating step than before the execution of the heat treating step. Non-ohmic conduction can be prevented in a region where the first impurity has a low concentration. Moreover, the method makes it possible to form, in the plane of the bonded interface, a mixture of a region where the first impurity has a high concentration and a region where the first impurity has a low concentration. This makes it possible to prevent the occurrence of non-ohmic conduction in the current pathway across the bonded interface.

(Feature 2) A second impurity that generates carriers in the first and second semiconductor layers may be present in a region in the first and second semiconductor layers in which the first impurity is present. The method allows carriers to be generated in the region in which the first impurity is present. This makes it possible to prevent the occurrence of non-ohmic conduction in the current pathway across the bonded interface.

(Feature 3) The method for manufacturing the semiconductor substrate described above may further comprise a first impurity-introducing step of introducing the second impurity into at least either the surface of the first semiconductor layer or the surface of the second semiconductor layer. The first impurity-introducing step may be executed before the bonding step. In the method described above, conditions for the introduction of the second impurity into the first semiconductor layer and conditions for the introduction of the second impurity into the second semiconductor layer may be different from each other. That is, each of the first and second semiconductor layers can be doped with appropriately controlled amounts of the second impurity, respectively.

(Feature 4) A thermal diffusion method may be used for the first impurity-introducing step. The thermal diffusion method in principle allows the second impurity to have maximum concentrations in the surfaces of the first and second semiconductor layers. This enables the second impurity to be present in high concentration in a region in the vicinity of the bonded interface.

(Feature 5) The irradiating step may include further irradiating at least either the surface of the first semiconductor layer or the surface of the second semiconductor layer with the second impurity. This allows the surface of the first semiconductor layer and the surface of the second semiconductor layer to be also activated by the step of implanting the second impurity.

(Feature 6) The method for manufacturing the semiconductor substrate described above may further comprise a second impurity-introducing step of implanting the second impurity from a back surface side of the first semiconductor layer opposite to the bonded interface of the semiconductor substrate produced in the bonding step. In the second impurity-introducing step, at least part of the second impurity may be implanted into the second semiconductor layer over the bonded interface. The method makes it possible to implant the second impurity such that at least part of the second impurity passes through the bonded interface. This allows carriers to be generated in the vicinity of the bonded interface.

(Feature 7) A range of presence of the first impurity in the first and second semiconductor layers may be encompassed in a range of presence of the second impurity in the first and second semiconductor layers. This allows carriers to be generated in the region in which the first impurity is present.

(Feature 8) The first and second semiconductor layers may be semiconductor layers with uniform diffusion of the second impurity that generates carriers in the first and second semiconductor layers. This allows carriers to be generated in the region in which the first impurity is present.

(Feature 9) A combination of the first and second semiconductor layers may be a combination of any two of single-crystalline 3C-SiC, single-crystalline 4H-SiC, single-crystalline 6H-SiC, and polycrystalline SiC.

(Feature 10) The heat treatment may be applied at a maximum temperature of 1500° C. or higher in the heat treating step.

(Feature 11) The first impurity may include any of argon (Ar), neon (Ne), and xenon (Xe).

(Feature 12) The second impurity may include either of nitrogen (N) and phosphorus (P).

Embodiment

<Configuration of Bonded Substrate>

Figure 2:
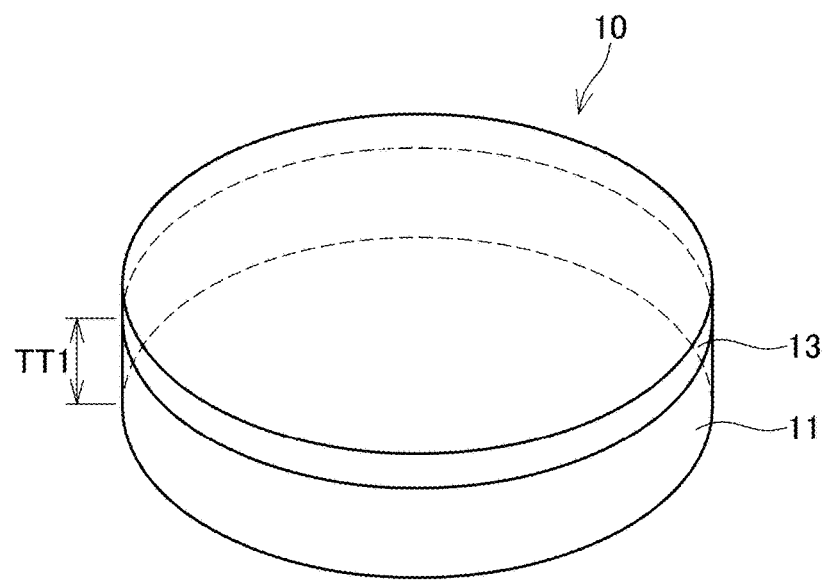
FIG. 2 is a perspective view of the bonded substrate.

FIG. 2 is a perspective view of a bonded substrate 10 according to the present embodiment. The bonded substrate 10 has an approximately disc-like shape. The bonded substrate 10 includes a support substrate 11 disposed on the underside, and a single-crystalline layer 13 bonded to the upper surface of the support substrate 11. The single-crystalline layer 13 may be formed from, for example, single crystals of a compound semiconductor (e.g., 6H-SiC, 4H-SiC, GaN, AlN). Alternatively, it may be formed from single crystals of a mono-element semiconductor (e.g., Si, C).

For the support substrate 11, various materials can be used. It is preferable that the support substrate 11 is resistant to various thermal processes applied to the single-crystalline layer 13. Additionally, it is preferable that the support substrate 11 is formed from a material with a small difference in thermal expansion coefficient between the single-crystalline layer 13 and this substrate 11. For example, if SiC is used for the single-crystalline layer 13, single-crystalline SiC, polycrystalline SiC, single-crystalline Si, polycrystalline Si, sapphire, GaN, carbon, or the like can be used for the support substrate 11. In the polycrystalline SiC, various poly-types and crystal face of SiC crystal may be mixed. Polycrystalline SiC in which various poly-types and crystal face are mixed can be manufactured without severe temperature control, thus it can be enable a reduction in the manufacturing cost of the support substrate 11. Thickness TT1 of the support substrate 11 needs to be set so as to obtain mechanical strength, which is able to withstand post-processing of semiconductor device manufacturing. For example, if the diameter of the support substrate 11 is 100 (mm), the thickness TT1 may be about 100 (micrometer).

<Method for Manufacturing Bonded Substrate>

A method for manufacturing a bonded substrate 10 according to the present embodiment is described with reference to FIGS. 1 and 3. The present embodiment describes, as an example, a case where the support substrate 11 is made of polycrystalline SiC and the single-crystalline layer 13 is made of single-crystalline 4H-SiC.

First, the support substrate 11 and the single-crystalline layer 13 are prepared. The support substrate 11 and the single-crystalline layer 13 have planarized surfaces. The planarization may be performed by polishing or cutting or may be performed by a CMP method.

In step S1, an impurity-introducing step is executed. In the impurity-introducing step, ions of an impurity are accelerated and implanted into the surface of the support substrate 11 and the surface of the single-crystalline layer 13. The impurity is an element that generates carriers in the support substrate 11 and the single-crystalline layer 13. Examples of the impurity include phosphorus (P), arsenic (As), boron (B), nitrogen (N), and the like. It should be noted that it is preferable that an impurity (e.g. nitrogen (N), phosphorus (P), or arsenic (As)) that is to serve as n-type carriers be used. In the impurity-introducing step, various parameters such as accelerating energy and an angle of incidence are set so that the highest impurity concentration is achieved at the surfaces of the support substrate 11 and the single-crystalline layer 13. Further, the various parameters may also be set so that the impurity concentration at the bonded interface is $1 \times 10^{19}/cm^3$ or higher (preferably $1 \times 10^{20}/cm^3$ or higher). For example, by performing very shallow implantation with a comparatively low accelerating energy (of several tens of kiloelectron volts or lower), control may be exercised so that the highest impurity concentration is achieved at the surfaces. Further, for example, by performing multi-stage implantation in which implantation is performed more than once with varied accelerating energies, control may be exercised so that the highest impurity concentration is achieved at the surfaces.

Further, conditions for implantation into the surface of the support substrate 11 and conditions for implantation into the single-crystalline layer 13 may be different from each other. The reason for this is as follows: In ion implantation, the angle of implantation with respect to a crystallographic axis greatly affects the impurity concentration profile; therefore, it may be inappropriate to use the same conditions for the support substrate 11, which is made of a polycrystal having various crystallographic axes, and the single-crystalline layer 13, which has a single crystallographic axis.

In step S2, an irradiating step is executed. The irradiating step is the step of forming an amorphous layer 11b by modifying the surface of the support substrate 11 and forming an amorphous layer 13b by modifying the surface of the single-crystalline layer 13. The term "amorphous layer" refers to a layer that is in a state where atoms do not have regularity such as that of a crystal structure.

Figure 3:
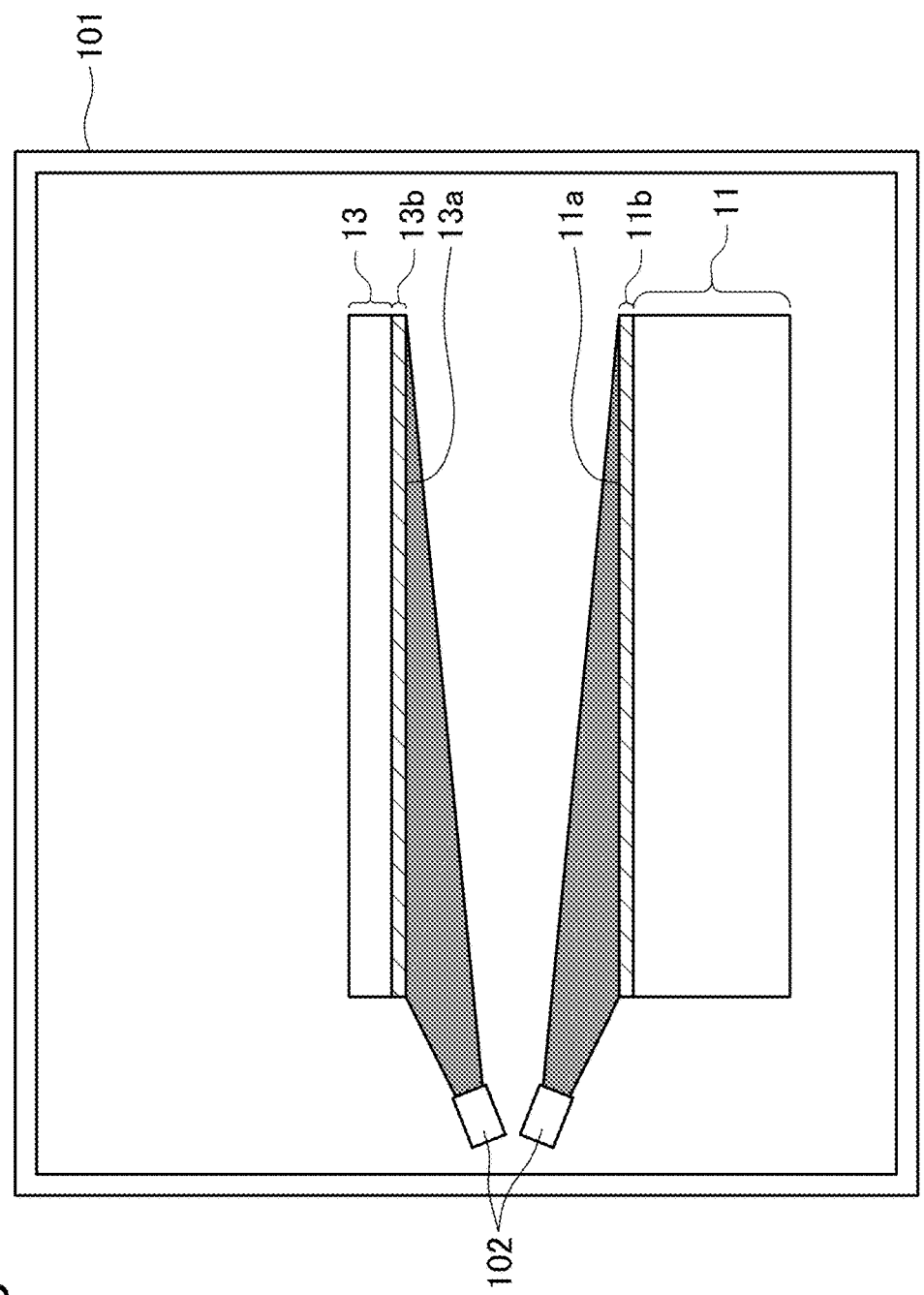
FIG. 3 is an explanatory diagram of the step of irradiating the bonded substrate.

As shown in FIG. 3, the single-crystalline layer 13 and the support substrate 11 are set into a chamber 101. Next, the single-crystalline layer 13 and the support substrate 11 are aligned relative to each other. The alignment is performed so that the substrates can make contact with each other in a correct positional relationship in the below-mentioned bonding step. Next, the chamber 101 is evacuated. The degree of vacuum in the chamber 101 may for example be about $1 \times 10^{-4}$ to $1 \times 10^{-6}$ (Pa).

Next, a surface 11a of the support substrate 11 and a surface 13a of the single-crystalline layer 13 are irradiated with beams of neutral atoms of argon from FAB (fast atom beam) guns 102. The entire surface 11a and the entire surface 13a are uniformly irradiated with the beams of neutral atoms of argon. For example, the surface 11a and the surface 13a may be entirely irradiated with the beams of neutral atoms of argon scanned them to have an overlapped area. This makes it possible to remove oxide layers and adsorbed layers from the surfaces 11a and 13a to expose the dangling bonds. This state is called an active state. Further, since the irradiating step is a process that is executed in a vacuum, the surfaces 11a and 13a can remain active without being subjected to oxidation or the like. Further, in the irradiating step, the crystal structures of the surfaces 11a and 13a can be destructed at certain depths from the surfaces. As a result, amorphous layers 11b and 13b containing Si and C can be formed on the substrates surfaces. Further, the amorphous layers 11b and 13b have argon atoms implanted therein. It should be noted that since argon, which is inert in a semiconductor, does not contribute to carries, argon may be implanted in a requisite minimum amount.

In step S3, a bonding step is executed. In the bonding step, the surface 11a of the support substrate 11 and the surface 13a of the single-crystalline layer 13 are brought into contact with each other in a vacuum in the chamber 101. This causes the dangling bonds present on the active surfaces to be combined, allowing the support substrate 11 and the single-crystalline layer 13 to be bonded to each other.

In step S4, a heat treating step is executed. In the heat treating step, the support substrate 11 and the single-crystalline layer 13 are subjected to heat treatment in a state where the amorphous layers 11b and 13b are in contact with each other. The heat treating step is executed with use of a furnace. The heat treating step may be executed under reduced pressure in the chamber 101 or may be executed in another furnace other than the chamber 101.

In the heat treating step, the support substrate 11 and the single-crystalline layer 13 are heated to a predetermined temperature. The predetermined temperature may be determined according to the material of which the bonded substrate 10 is made. For example, in a case where the bonded substrate 10 is made of SiC, the support substrate 11 and the single-crystalline layer 13 may be heated to 1500° C. or higher (preferably 1700° C. or higher). This allows the amorphous layers 11b and 13b to have fluidity. A space may be formed in the surface of contact between the amorphous layers 11b and 13b. The volume of the space to be formed becomes larger as the roughness of the amorphous layers 11b and 13b becomes higher. Given these circumstances, the heat treating step is executed to cause the atoms forming the amorphous layers 11b and 13b to flow, thus making it possible to fill the space formed in the surface of contact between the amorphous layers 11b and 13b.

Further, the heat treating step can recrystallize the amorphous layers 11b and 13b from a state of having no regularity in atomic arrangement to a state of having regularity in atomic arrangement. Upon completion of the recrystallization, the amorphous layers 11b and 13b disappear, so that the bonded substrate 10 is formed with the single-crystalline layer 13 and the support substrate 11 directly bonded to each other.

The recrystallization is considered to progress from the vicinities of the crystals and reach the bonded interface. In the process of recrystallization, atoms (such as nitrogen or phosphorus) that are to serve as carriers are incorporated into the SiC crystals, but argon atoms, which are inert atoms, are not incorporated into the SiC crystals. For this reason, argon atoms are considered to be excluded from the crystalline regions as the recrystallization progresses. Upon completion of the recrystallization, the amorphous layers 11b and 13b disappear, so that the bonded substrate 10 is formed with the single-crystalline layer 13 and the support substrate 11 directly bonded to each other. However, in the process of recrystallization, the atoms (such as nitrogen or phosphorus) that are to serve as carriers are dispersed in the crystals, and argon is predicted to be segregated at the interface.

Further, the heat treating step causes the support substrate 11 and the single-crystalline layer 13 to be rigidly bonded. Further, the heat treating step causes the atoms (e.g. nitrogen or phosphorus) that are to serve as n-type carriers to be high-concentration n-type carriers.

<Concentration Profile of Argon>

Figure 4:
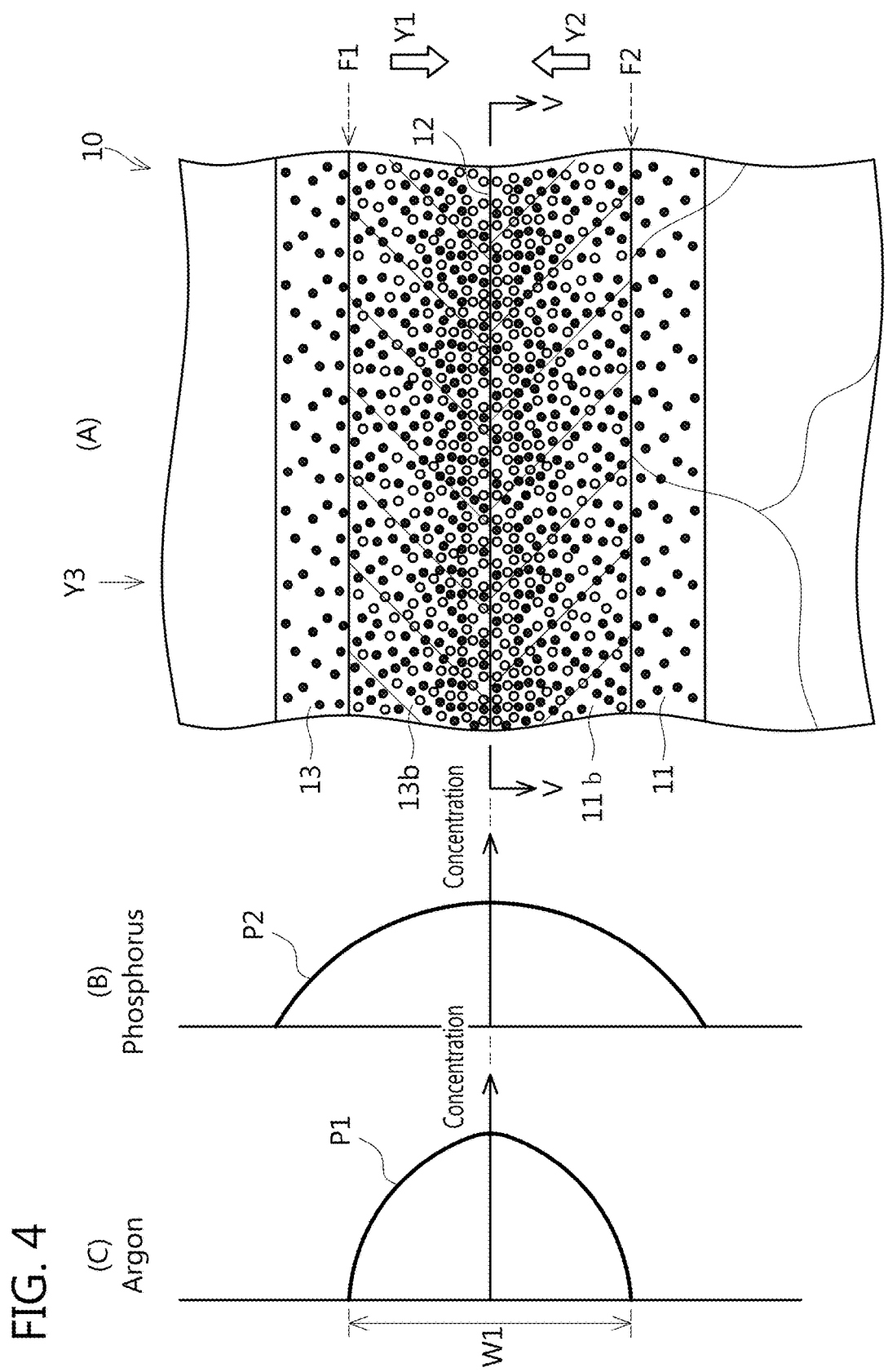
FIG. 4 is a partially-enlarged view of the bonded interface and the vicinity thereof before the step of applying heat treatment to the bonded substrate.
Figure 5:
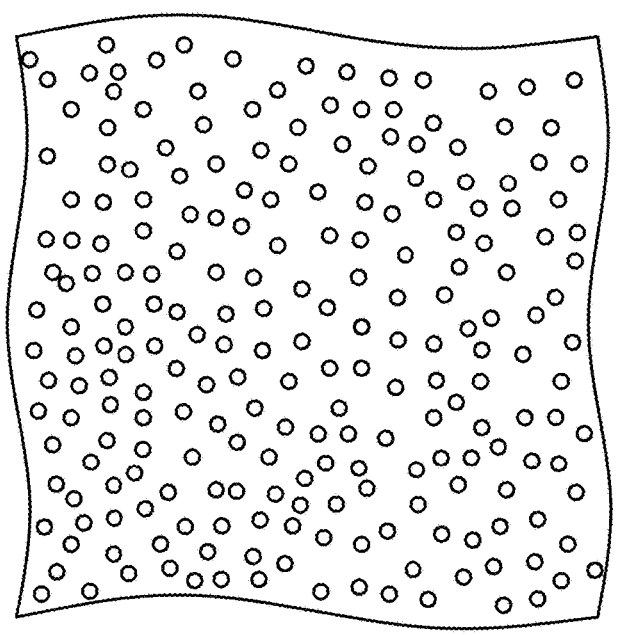
FIG. 5 is a cross-sectional view taken along line V-V.
Figure 6:
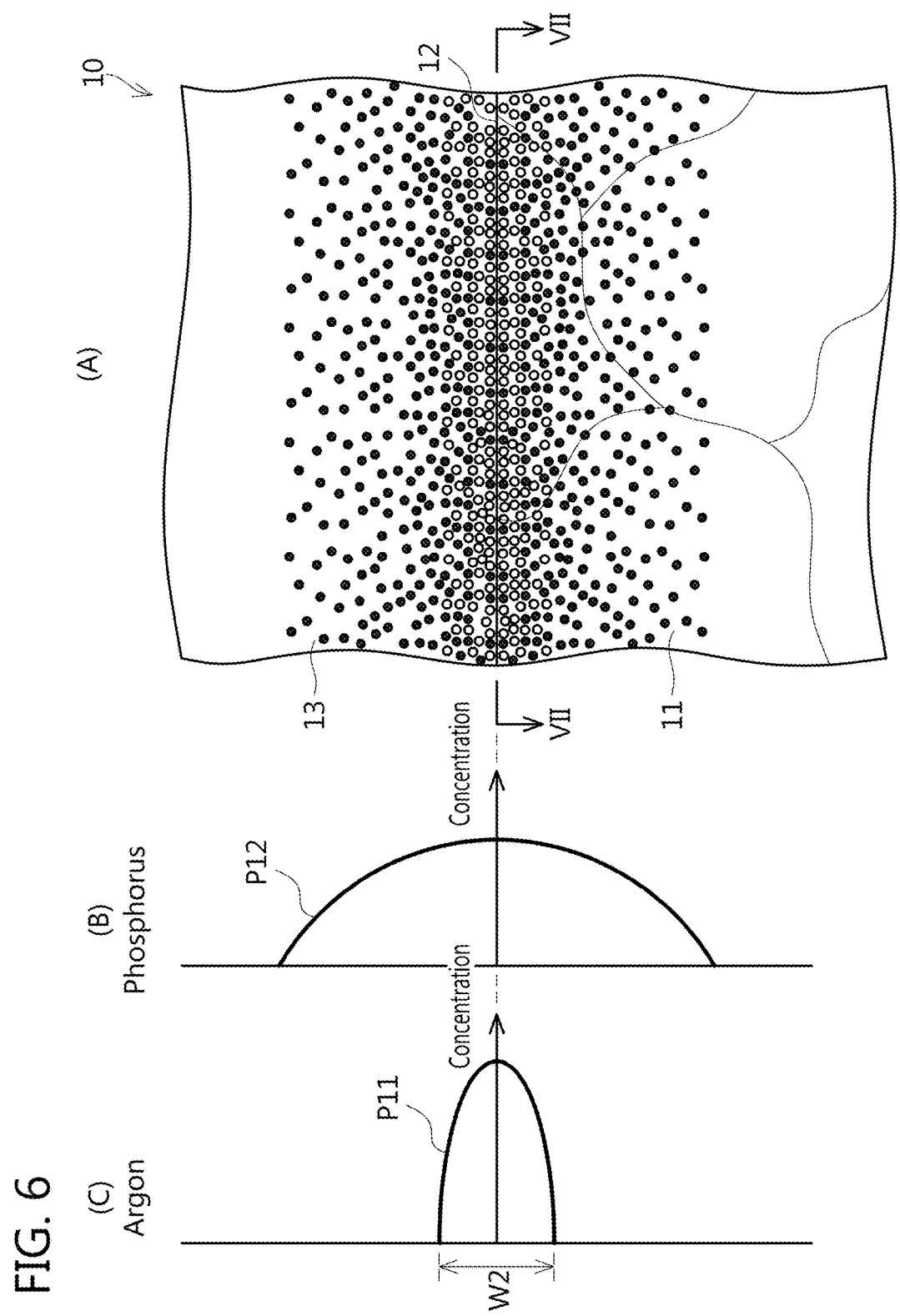
FIG. 6 is a partially-enlarged view of the bonded interface and the vicinity thereof after the step of applying heat treatment to the bonded substrate.
Figure 7:
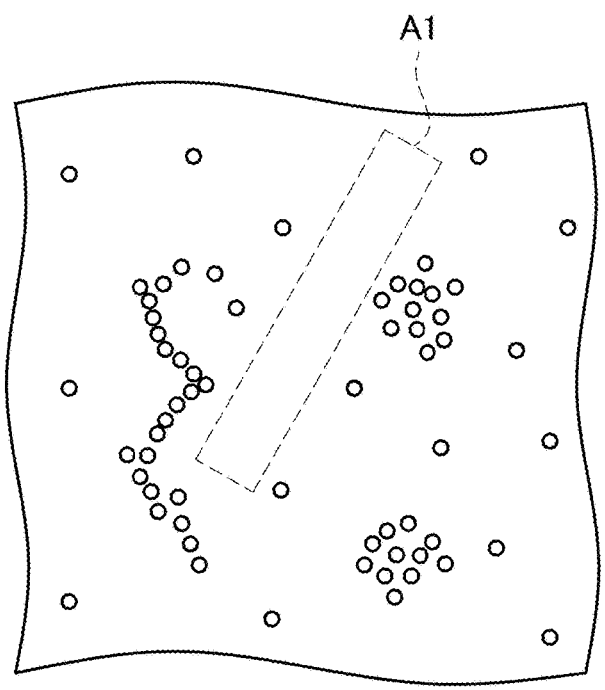
FIG. 7 is a cross-sectional view taken along line VII-VII.

Changes in a concentration profile of argon before and after the heat treating step are described in detail with reference to FIGS. 4 to 7. It should be noted that, in FIGS. 4 and 6, the white circles simulatively represent argon atoms and the black circles simulatively represent phosphorus atoms. Further, in FIGS. 4 and 6, the crystal grain boundary of polycrystalline SiC is simulatively described in a net-like fashion. Further, for viewability of the drawings, FIGS. 5 and 7 show only argon atoms (white circles). FIG. 4A is a partially-enlarged view of the bonded interface of the bonded substrate 10 and the vicinity thereof before the heat treating step (step S4). FIG. 4B is a concentration profile of phosphorus. FIG. 4C is a concentration profile of argon. In FIG. 4B and FIG. 4C, the vertical axis represents the distance from the bonded interface 12, and the horizontal axis represents the impurity concentration. That is, FIG. 4B shows a distribution of the black circles of FIG. 4A, and FIG. 4C shows a distribution of the white circles of FIG. 4A. FIG. 5 is a cross-sectional view taken along line V-V of FIG. 4. That is, FIG. 5 is a diagram of a surface of the amorphous layer 11b as observed from a direction perpendicular to the bonded substrate 10. FIG. 6A is a partially-enlarged view of the same part as that shown in FIG. 4A after the heat treating step. FIG. 6B is a concentration profile of phosphorus. FIG. 6C is a concentration profile of argon. FIG. 7 is a partially-enlarged view of the same part as that shown in FIG. 5 after the heat treating step.

The concentration profile of argon before the heat treating step is described. As shown in FIG. 4A, in the bonded substrate 10, the amorphous layer 11b, formed by destructing the surface of the support substrate 11, and the amorphous 13b, formed by destructing the surface of the single-crystalline layer 13, are in contact with each other. As shown in FIG. 4A, the amorphous layers 11b and 13b have argon atoms implanted thereinto by the irradiating step of step S2. Before the heat treating step, the concentration profile P1 (see FIG. 4C) of argon atoms in a depth direction (i.e. a vertical direction of FIG. 4A) is in conformance with a Gaussian distribution. Therefore, the amorphous layers 11b and 13b have argon atoms dispersed in the entire depth directions thereof. Further, as shown in FIG. 5, the in-plane concentration profile of argon atoms as obtained by observing the surface of the amorphous layer 11b is uniform before the heat treating step. In other words, the in-plane density of argon atoms is constant before the heat treating step. This is because the surface of the support substrate 11 and the surface of the single-crystalline layer 13 are uniformly irradiated with the beams of neutral atoms of argon in step S2.

Next, the concentration profile of argon after the heat treating step is described. In the heat treating step (step S4), the entire bonded substrate 10 is heated by heat treatment with use of a furnace.

In a case where the amorphous layers 11b and 13b are subjected to heat treatment, the amorphous layers 11b and 13b can be recrystallized from a state of having no regularity in atomic arrangement to a state of having regularity in atomic arrangement. The recrystallization of the amorphous layer 13b is performed from an interface F1 (see FIG. 4A) between the amorphous layer 13b and the single-crystalline layer 13 toward an inner side of the amorphous layer 13b (i.e. a lower side of FIG. 4A; see the arrow Y1) so that the resulting atomic arrangement is in conformance with the crystal structure (single-crystalline SiC) of the single-crystalline layer 13. Further, the recrystallization of the amorphous layer 11b is performed from an interface F2 (see FIG. 4A) between the amorphous layer 11b and the support substrate 11 toward an inner side of the amorphous layer 11b (i.e. an upper side of FIG. 4A; see the arrow Y2) so that the resulting atomic arrangement is in conformance with the crystal structure (polycrystalline SiC) of the support substrate 11. Therefore, upon completion of the recrystallization, as shown in FIG. 6A, the amorphous layers 11b and 13b disappear, so that the bonded substrate 10 is formed with the single-crystalline layer 13 and the support substrate 11 directly bonded to each other as shown in FIG. 6A. Since the amorphous layers 11b and 13b are recrystallized in an integrated manner, the single-crystalline layer 13 and the support substrate 11 can be firmly bonded to each other by a covalent bond.

Further, argon atoms are not incorporated into a crystal lattice of SiC. Therefore, argon atoms move to a recrystallization-free region as the recrystallization of the amorphous layer 13b progresses. That is, the argon atoms move in the direction of the arrow Y1 of FIG. 4A. Then, once the argon atoms reach a region in the vicinity of the bonded interface 12, the argon atoms are immobilized in the region in the vicinity of the bonded interface 12. Similarly, argon atoms in the amorphous layer 11b are not incorporated into the crystal and therefore move to the recrystallization-free region as the recrystallization of the amorphous layer 11b progresses. That is, the argon atoms move in the direction of the arrow Y2 of FIG. 4A. Then, once the argon atoms reach the region in the vicinity of the bonded interface 12, the argon atoms are immobilized in the region in the vicinity of the bonded interface 12. As a result, upon completion of the recrystallization of the amorphous layers 11b and 13b, as shown in FIG. 6A, the argon atoms come to coagulate in the vicinity of the bonded interface 12 between the support substrate 11 and the single-crystalline layer 13.

Therefore, the concentration profile of argon after the heat treating step becomes a concentration profile P11 (see FIG. 6C). Moreover, the width W2 of the concentration profile P11 (see FIG. 6C) of argon after the heat treating step is smaller than the width W1 of the concentration profile P1 (see FIG. 4C) of argon before the heat treating step. That is, the execution of the heat treating step (step S4) described herein makes it possible to narrow the width of the in-depth concentration profile of argon contained in the support substrate 11 and the single-crystalline layer 13.

Further, FIG. 7 shows an in-plane concentration profile of argon atoms as obtained by observing the surface of the support substrate 11 after the heat treating step. The argon atoms move in an in-plane direction and partially coagulate to form island-shaped and linear coagulated portions. That is, the execution of the heat treating step (step S4) described herein allows a concentration variation of argon in the in-plane direction in the support substrate 11 and the single-crystal layer 13 to be greater than before the heat treating step (see FIG. 5).

<Analysis of Argon Concentration Profile>

A concentration profile of argon in the vicinity of the bonded surface between the support substrate 11 and the single-crystalline layer 13 of a bonded substrate 10 fabricated by the bonding method described herein was analyzed. In the bonded substrate 10 used in the analysis, the support substrate 11 was made of polycrystalline SiC, and the single-crystalline layer 13 was made of single-crystalline 4H-SiC. In the impurity-introducing step (step S1), irradiation with phosphorus atoms took place for 60 (sec) with an incident energy of 10 (keV). In the irradiating step (step S2), irradiation with argon atoms took place for 60 (sec) with an incident energy of 1.8 (keV). In the heat treating step (step S4), the highest temperature was 1700° C. Further, the electrical characteristics of a current pathway across the bonded interface 12 before and after the heat treating step were measured. As a result, it was found that, in the heat treating step, the occurrence of non-ohmic conduction was able to be prevented.

An argon concentration analysis was conducted on this bonded substrate by an energy dispersive X-ray analysis method (EDX). The elemental analyzer was a NORAN's VOYAGER III M3100. The beam diameter was about 1 nm, and in consideration of the spread of the beams in the sample, the spatial resolution of this analysis was 2 nm. Further, the widths W1 and W2 were obtained by measuring the widths of a region in which 90% of the argon implanted was present.

The width W1 of the concentration profile P1 before the heat treating step was about 4 nm. Further, the width W2 of the concentration profile P11 after the heat treating step was about 2 nm, which is the spatial resolution of this analysis. That is, it was found that the occurrence of non-ohmic conduction can be prevented by narrowing the width of the concentration profile of argon to about 2 nm or smaller.

Further, the concentration variation of argon in the in-plane direction was measured. A sufficient number of concentrations of argon at the bonded interface 12 were measured in different places in a cross-section (see FIG. 6A) of a part in the vicinity of the bonded interface 12. The measurement range was about 200 nm. Then, the concentration ratio (maximum value/minimum value) of the maximum value to the minimum value was obtained as a variation among that argon concentrations thus measured. Further, the difference between the concentration before the heat treating step and the concentration after the heat treating step was measured. Before the heat treating step, the concentration variation was 1.3 to 1.5. On the other hand, after the heat treating step, the concentration variation increased to 9.1. That is, it was found that the occurrence of non-ohmic conduction can be prevented by controlling the concentration variation, which is indicated by the concentration ratio of the maximum argon concentration value to the minimum argon concentration value, to be about twice or more times as great (preferably about nine or more times as great). (i.e., the maximum argon concentration value is greater than twice the minimum argon concentration value).

<Effects>

The irradiating step (step S2) causes argon to be implanted into the vicinity of the surface of the support substrate 11 and the vicinity of the surface of the single-crystalline layer 13. This causes argon having the concentration profile P1 (see FIG. 4C) to be present in the vicinity of the bonded interface 12 in the bonded substrate 10 produced in the bonding step (step S3). The presence of argon in the vicinity of the bonded interface 12 may cause non-ohmic conduction to occur in the current pathway across the bonded interface 12. The execution of the heat treating step (step S4) described herein makes it possible to narrow the width of the concentration profile of argon from the width W1 (see FIG. 4C) to the width W2 (see FIG. 6C). This makes it possible to reduce, on the current pathway across the bonded interface 12, the distance of a pathway in which argon is present. Further, the narrowing of a region in which defect levels are present due to defects generated by the concentration of argon on the vicinity of the interface brings about an effect of making it easy to effect tunneling that is induced by a high-concentration n-type layer. As a result, this makes it possible to prevent the occurrence of non-ohmic conduction.

The execution of the heat treating step (step S4) described herein makes it possible to control the range of presence (see FIG. 6C) of the concentration profile P11 of argon to be encompassed in the range of presence (see FIG. 6B) of the concentration profile P12 of phosphorus as shown in FIG. 6. It is known from experiments conducted by the applicants and the like of the present application that the presence of a carrier-generating impurity such as phosphorus around argon can prevent the occurrence of non-ohmic conduction on the current pathway across the bonded interface 12. A model of this phenomenon has not yet been clearly elucidated. However, the following model is conceivable. At the bonded interface 12, the formation of levels due to the presence of argon and the formation of an energy barrier cause non-ohmic conduction to occur. Therefore, the generation of carriers in the vicinity of the bonded interface 12 can bring about tunneling by narrowing the width of the energy barrier. That is, the occurrence of non-ohmic conduction can be prevented by the high-concentration n-type carriers. This makes it possible to prevent the occurrence of non-ohmic conduction.

Furthermore, the present invention can bring about the following effects. The execution of the heat treating step (step S4) described herein can cause the argon atoms to move in an in-plane direction and partially coagulate to form island-shaped and linear coagulated portions (see FIG. 7). This makes it possible to form, in the plane of the bonded interface 12, a mixture of high-argon-concentration regions (i.e. the coagulated portions) and a low-argon-concentration region (e.g. a region A1 of FIG. 7). In the low-argon-concentration region, non-ohmic conduction can be prevented. Therefore, the mixture of the low-argon-concentration region makes it possible to prevent the occurrence of non-ohmic conduction in the entire current pathway across the bonded interface 12. That is, the low-argon-concentration region can be used as a current path for preventing the occurrence of non-ohmic conduction.

Figure 8:
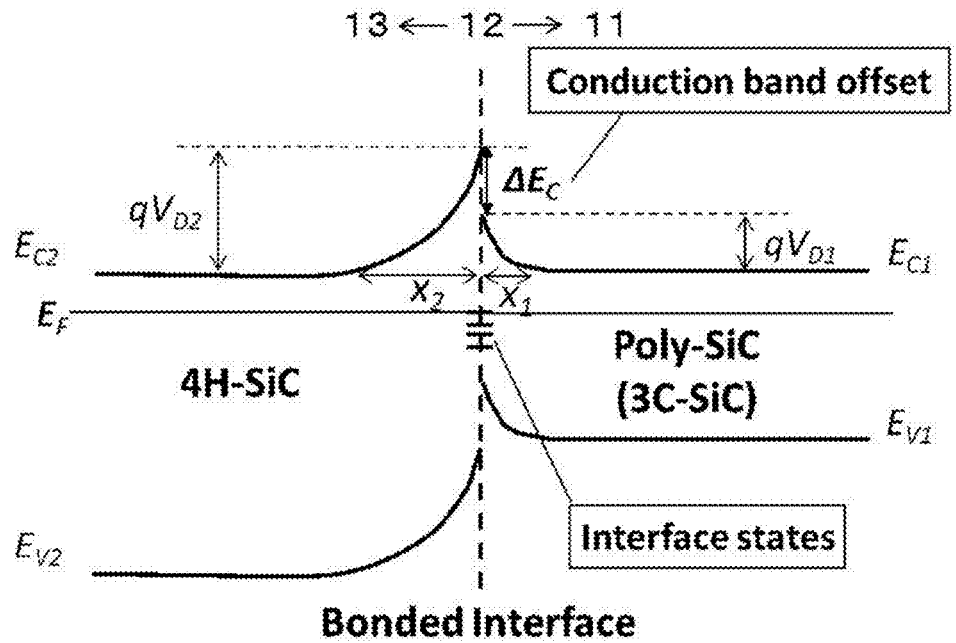
FIG. 8 is an explanatory diagram of an electronic barrier.

The effects that are brought about by the technology disclosed herein are described from another aspect. An example of a cause of the occurrence of non-ohmic electrical characteristics at the bonded interface 12 is a difference in bandgap energy between the semiconductors. As shown in FIG. 8, quantum-mechanically, an electronic barrier is considered to be present. In the case example shown in FIG. 8, the support substrate 11 is made of n-type polycrystalline 3C-SiC and has a bandgap energy of 2.2 eV. Further, the single-crystalline layer 13 is made of single-crystalline 4H-SiC and has a bandgap energy of 3.2 eV. Such a potential barrier is considered to be generated at the bonded interface 12 and a region in the vicinity thereof due to the difference in bandgap energy between 4H and 3C, trap levels generated by argon present at the interface, the unconformity of the bonded interface, and the like. Moreover, the technology disclosed herein allows an impurity (e.g. phosphorus or nitrogen) that generates n-type high-concentration carriers to be present in a region in the vicinity of the interface in which an impurity such as inert argon is necessarily present by the FAB guns. This makes it possible to bring about improvement in non-ohmic characteristics by inducing tunneling. Further, the generation of n-type high-concentration carriers is enabled by a very simple process flow in which, in a vacuum chamber in which argon irradiation takes place, phosphorus or nitrogen irradiation takes place before or after the argon irradiation.

Figure 9:
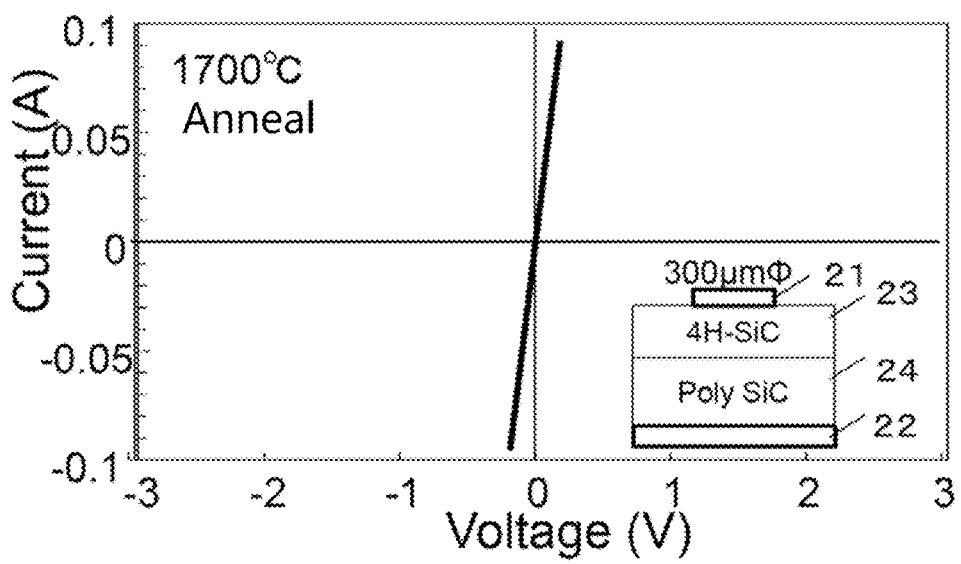
FIG. 9 is a graph showing a result of measurement of interface characteristics.

FIG. 9 shows a result of measurement of actual interface characteristics. The measuring objects are a single-crystalline 4H-SiC layer 23 (which corresponds to the single-crystalline layer 13) and a polycrystalline SiC substrate 24 (which corresponds to the support substrate 11) that were bonded to each other in the bonding method described herein. The single-crystalline 4H-SiC layer 23 includes a surface electrode 21. The polycrystalline SiC substrate 24 includes a back surface electrode 22. FIG. 9 is a I-V curve between the surface electrode 21 and the back surface electrode 22. FIG. 9 shows that ohmic conduction is achieved.

An embodiment of the present invention has been described in detail with reference to the drawings, however, this is a mere exemplary indication and thus does not limit the scope of the claims. The art described in the claims includes modifications and variations of the specific examples presented above.

<First Modification>

The impurity-introducing step may be executed after the bonding step (step S3). In this case, ions of an impurity need only be implanted into a surface of the single-crystalline layer 13 opposite to the bonded interface 12 (i.e. in the direction of the arrow Y3 of FIG. 4A). In the impurity-introducing step, various parameters such as accelerating energy and an angle of incidence need only be set so that at least part of the impurity are implanted into the support substrate 11 over the bonded interface 12. Further, various parameters pertaining to implantation need only be set so that the highest impurity concentration is achieved in the vicinity of the bonded interface 12. For example, by performing multi-stage implantation in which implantation is performed more than once with varied accelerating energies, control may be exercised so that the highest impurity concentration is achieved in the vicinity of the bonded interface 12.

<Second Modification>

The impurity that generates carriers in the support substrate 11 and the single-crystalline layer 13 is not limited to an embodiment in which it is introduced in the impurity-introducing step. The impurity-introducing step may be omitted by using a support substrate 11 and a single-crystalline layer 13 into which an impurity has been introduced in advance. In the present embodiment, it is only necessary to use an n-type support substrate 11 and an n-type single-crystalline layer 13 that are doped with a high concentration of nitrogen, phosphorus, or the like. Further, the concentration of an impurity with which the substrate is doped in advance needs only be equal to or higher than the concentration of an impurity at the bonded interface that is introduced in the impurity-introducing step. In the present embodiment, it is only necessary to use an n-type support substrate 11 and an n-type single-crystalline layer 13 that are doped with $1 \times 10^{19}/cm^3$ or more of nitrogen or phosphorus.

Alternatively, the impurity-introducing step may be executed on a support substrate 11 and a single-crystalline layer 13 into which an impurity has been introduced in advance. A specific example of this case is described. An n-type support substrate 11 and an n-type single-crystalline layer 13 that are doped with nitrogen, phosphorus, or the like are prepared. The execution of the impurity-introducing step (step S1) to the heat treating step (step 4) gives a concentration profile such as that shown in FIG. 6. The width of the concentration profile P12 (see FIG. 6B) of the impurity (e.g. nitrogen or phosphorus) that is to serve as n-type carriers was 4 nm on either side of the bonded interface 12. Further, the width of the concentration profile P11 of argon was 2 nm on either side of the bonded interface 12. In this case, sufficient tunneling can be achieved even if there is an electronic barrier at the bonded interface 12, provided the concentration of n-type carriers is for example $10^{20}/cm^3$ or higher. Further, argon, which is an inert impurity, forms levels of crystal defects in the support substrate 11 and the single-crystalline layer 13, which are made of n-type semiconductors. The defect levels function as lifetime killers of the carriers and therefore reduce the mobility of the carriers. Given these circumstances, the influences of the levels of crystal defects can be mitigated by causing the impurity (e.g. nitrogen or phosphorus) that is to serve as n-type carriers to be present in the range of presence of argon. Further, the effects of interface states due to interface unconformity can also be mitigated by the presence of the impurity that is to serve as n-type carriers.

<Third Modification>

The method for activating the surfaces in the irradiating step (step S2) is not limited to a method for irradiating the surfaces with the beams of neutral atoms of argon. The impurity may be one that is hardly incorporated into lattices of the semiconductors and that is highly effective in activating the surfaces of the semiconductor layers by irradiation from the FAB guns. Alternatively, the impurity may be one that hardly becomes carriers and that highly effective in activating the surfaces of the semiconductor layers by irradiation from the FAB guns. For example, irradiation with beams of atoms of noble gas such as neon (Ne) or xenon (Xe) may take place. Alternatively, for example, it is possible to employ a method for implanting atoms, molecules, or ions of He, hydrogen, Ar, Si, C, or the like. Further, in the irradiating step (step S2), irradiation with ions of impurity atoms that generate carriers may take place. The embodiment described herein may further include irradiation with ions of nitrogen, phosphorus, or the like in the irradiating step. It should be noted that it is preferable that irradiation with nitrogen take place in the irradiating step. This allows the process for activating the surfaces of the support substrate 11 and the single-crystalline layer 13 to also function as the process for implanting nitrogen, phosphorus, or the like into the support substrate 11 and the single-crystalline layer 13. This makes it possible to omit the impurity-introducing step (step S1), thus making it possible to reduce the number of steps. Further, the FAB guns are not the only apparatuses that are used to activate the surfaces. The FAB guns may be replaced by various apparatuses such as ion guns.

<Fourth Modification>

The method that is used in the impurity-introducing step (step S1) is not limited to ion implantation. For example, a thermal diffusion method may be used. The thermal diffusion method is based on the principle that the support substrate 11 and the single-crystalline layer 13 are heated with a high concentration of an impurity such as phosphorus present in the surfaces of the support substrate 11 and the single-crystalline layer 13. This makes it possible to maximize the concentration of the impurity such as phosphorus in the surfaces of the support substrate 11 and the single-crystalline layer 13. Further, this makes it possible to make the width of the concentration profile of the impurity narrower than in the case where ion implantation is used. This enables the impurity to form a concentration profile having a width corresponding to the width (of about several nms) of an energy barrier that can be passed through by tunneling. It should be noted that in a case where the semiconductor materials into which the impurity is introduced are SiC, the thermal diffusion method may be used in the impurity-introducing step. Since SiC has a very small coefficient of thermal diffusivity of an impurity, it is preferable that thermal diffusion be performed at a high temperature of about 1700 to 2000° C. This makes it possible to perform diffusion of about several nms that can cause tunneling to occur.

<Fifth Modification>

As shown in FIG. 1, an etching step (step S0) may be executed before the impurity-introducing step (step S1). The etching step may be identical in content to the aforementioned irradiating step (step S2). That is, in the etching step, the support substrate 11 and the single-crystalline layer 13 are set into the chamber 101 in a vacuum state. Then, the surfaces of the support substrate 11 and the single-crystalline layer 13 are irradiated with beams of neutral atoms of argon. This makes it possible to intensely etch the surfaces of the support substrate 11 and the single-crystalline layer 13, thus making it possible to surely remove oxide layers and the like. After that, the impurity-introducing step (step S1) and the irradiating step (step S2) need only be executed in the chamber 101. Examples of conditions for the etching step include conditions under which irradiation with argon atoms takes place for 10 (sec) with an incident energy of 1.8 (keV).

<Sixth Modification>

In the impurity-introducing step, an impurity that is to serve as n-type carriers may be implanted only into the surface of the single-crystalline layer 13 but not into the surface of the support substrate 11. For example, in a case where the support substrate 11 is made of polycrystalline SiC subjected to an electrical resistance-reducing process, the implantation of an impurity that is to serve as n-type carriers into the surface of the support substrate 11 may be omitted. An example of polycrystalline SiC subjected to an electrical resistance-reducing process is polycrystalline SiC into which an impurity has been introduced in advance.

<Seventh Modification>

Figure 10:
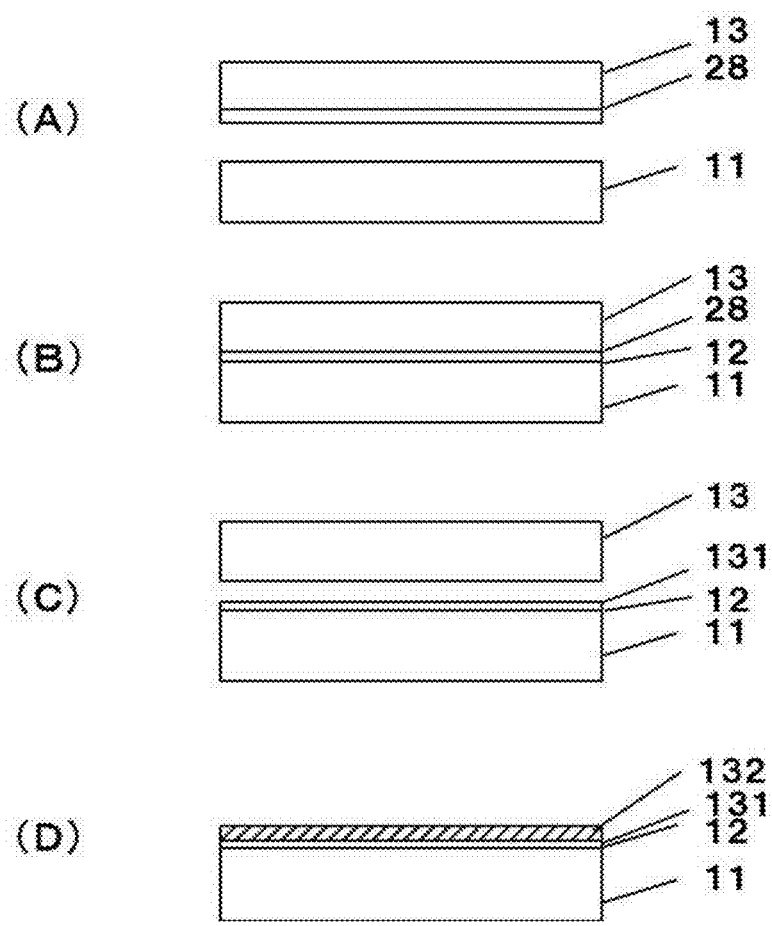
FIG. 10 is a diagram showing a method for manufacturing a bonded substrate including a delaminating step.

The manufacturing flow described herein may be applied to a technique called "smart cut (registered trademark)", which is described with reference to FIG. 10.

FIG. 10A is a cross-sectional view showing a state where the support substrate 11 and a single-crystalline layer 13 are to be bonded to each other. The single-crystalline layer 13 has a hydrogen-implanted layer 28 formed in advance at a position of a depth of 0.5 micrometer of the bonded surface. In FIG. 10B, up to the bonding step (step S3) described herein is executed. In FIG. 10C, the heat treating step (step S4) described herein is executed. This allows a single-crystalline layer 131 to be separated at the hydrogen-implanted layer 28 by being heated to a high-temperature state of 1000° C. or higher. This results in the formation of a structure in which a thin single-crystalline layer 131 having a thickness of 0.5 micrometer bonded on the support substrate 11. It should be noted that the single-crystalline layer 13 can be reutilized. In FIG. 10D, a single-crystalline SiC layer having a required thickness is epitaxially grown on the thin single-crystalline layer 131. This causes an epitaxial layer 132 to be formed. The epitaxial layer 132 serves as a region in which various devices are formed. In order for the various devices to be formed, the epitaxial layer 132 needs to have a thickness of about 10 micrometer.

<Other Modifications>

The single-crystalline layer 13 is not limited to a single crystal of 4H-SiC. Various polytypes of single-crystalline SiC, such as 3C-SiC and 6H-SiC, can be used as the single-crystalline layer 13.

The material used in the support substrate 11 is not limited to polycrystalline SiC. Any material that withstands various heat processes applied to the single-crystalline layer 13 suffices.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The single-crystalline layer 13 is an example of a first semiconductor layer. The support substrate 11 is an example of a second semiconductor layer. Argon is an example of a first impurity. Nitrogen and phosphorus are examples of a second impurity.

EXPLANATION OF REFERENCES

10: bonded substrate, 11: support substrate, 12: bonded interface, 13: single-crystalline layer, 101: chamber, 102: FAB guns, P1, P2, P11 and P12: concentration profile

The invention claimed is:

1. A method for manufacturing a semiconductor substrate including a first semiconductor layer and a second semiconductor layer that is in contact with the first semiconductor layer, comprising:

irradiating a surface of the first semiconductor layer with one or more types of first impurity in a vacuum and irradiating a surface of the second semiconductor layer with the one or more types of first impurity in the vacuum;

bonding the surface of the first semiconductor layer and the surface of the second semiconductor layer to each other in the vacuum in which the irradiating the surface of the first and second semiconductor layer was executed and thereby producing a semiconductor substrate having a bonded interface; and applying heat treatment to the semiconductor substrate produced in the bonding, wherein the first impurity is an inert impurity that does not generate carriers in the first and second semiconductor layers, the heat treatment is applied such that a region in the vicinity of the bonded interface between the first semiconductor layer and the second semiconductor layer is recrystallized, and a width of an in-depth concentration profile of the first impurity contained in the vicinity of the bonded interface is narrower after execution of the heat treatment than before the execution of the heat treatment.

2. The method according to claim 1, wherein the heat treatment is applied such that a concentration variation of the first impurity in an in-plane direction in the vicinity of the bonded interface is greater after the execution of the heat treatment than before the execution of the heat treatment.

3. The method according to claim 1, wherein a second impurity that generates carriers in the first and second semiconductor layers is present in a region in the first and second semiconductor layers in which the first impurity is present.

4. The method according to claim 3, further comprising introducing the second impurity into at least either the surface of the first semiconductor layer or the surface of the second semiconductor layer, wherein the introducing is executed before the bonding step.

5. The method according to claim 4, wherein a thermal diffusion method is used for the introducing.

6. The method according to claim 3, wherein the irradiating step includes further irradiating at least either the surface of the first semiconductor layer or the surface of the second semiconductor layer with the second impurity.

7. The method according to claim 6, further comprising implanting the second impurity from a back surface side of the first semiconductor layer opposite to the bonded interface of the semiconductor substrate produced in the bonding step,
wherein in the implanting, at least part of the second impurity is implanted into the second semiconductor layer through the bonded interface.

8. The method according to claim 3, wherein a range of presence of the first impurity in the first and second semiconductor layers is encompassed in a range of presence of the second impurity in the first and second semiconductor layers.

9. The method according to claim 1, wherein the first and second semiconductor layers are semiconductor layers with uniform distribution of the second impurity that generates carriers in the first and second semiconductor layers.

10. The method according to claim 1, wherein a combination of the first and second semiconductor layers is a combination of any two of single-crystalline 3C-SiC, single-crystalline 4H-SiC, single-crystalline 6H-SiC, and polycrystalline SiC.

11. The method according to claim 10, wherein the heat treatment is applied at a maximum temperature of 1500° C. or higher in the heat treatment.

12. The method according to claim 1, wherein the first impurity includes any of argon (Ar), neon (Ne), and xenon (Xe).

13. The method according to claim 3, wherein the second impurity includes at least one of nitrogen (N) and phosphorus (P).

14. A semiconductor substrate comprising:
a first semiconductor layer; and
a second semiconductor layer that is in contact with the first semiconductor layer,
wherein the first and second semiconductor layers have a first impurity and a second impurity introduced thereinto, the first impurity being an inert impurity that does not generate carriers in the first and second semiconductor layers, and the second impurity that generates carriers in the first and second semiconductor layers,
a certain ratio or more of a total amount of the first impurity is present in a first impurity region with a certain value or less of depth from an interface between the first and second semiconductor layers,
a certain ratio or more of a total amount of the second impurity is present in a second impurity region with a certain value or less of depth from the interface between the first and second semiconductor layers,
the second impurity region is greater in depth than the first impurity region, and
90% or more of a total amount of the first impurity is present in the first impurity region within 2 nm from the interface between the first and second semiconductor layers.

15. The semiconductor substrate according to claim 14, wherein a maximum first impurity concentration value is greater than twice the amount of a minimum first impurity concentration value in the interface between the first and second semiconductor layers.

16. The semiconductor substrate according to claim 15, wherein
the first impurity coagulates in an in-plane direction, and
the difference between the maximum first impurity concentration value and the minimum first impurity concentration value is due to the coagulation of the first impurity.

17. The semiconductor substrate according to claim 14, wherein the second impurity includes at least one of nitrogen (N) and phosphorus (P).

18. The semiconductor substrate according to claim 14, wherein a combination of the first and second semiconductor layers is a combination of any two of single-crystalline 3C-SiC, single-crystalline 4H-SiC, single-crystalline 6H-SiC, and polycrystalline SiC.

19. The semiconductor substrate according to claim 14, wherein the first impurity includes any of argon (Ar), neon (Ne), and xenon (Xe).

* * * * *